United States Patent
Qian (10) Patent No.: US 9,997,605 B2
(45) Date of Patent: Jun. 12, 2018

(54) LDMOS DEVICE AND ITS MANUFACTURING METHOD

(71) Applicant: Wensheng Qian, Shanghai (CN)

(72) Inventor: Wensheng Qian, Shanghai (CN)

(73) Assignee: SHANGHAI HUAHONG GRACE SEMICONDUCTOR MANUFACTURING CORPORATION, Pudong New Area, Shanghai (CN)

( * ) Notice: Subject to any disclaimer, the term of this patent is extended or adjusted under 35 U.S.C. 154(b) by 96 days.

(21) Appl. No.: 14/580,126

(22) Filed: Dec. 22, 2014

(65) Prior Publication Data

US 2016/0181400 A1 Jun. 23, 2016

(30) Foreign Application Priority Data

Jun. 13, 2014 (CN) .............................. 2014 1 026236

(51) Int. Cl.
| | |
|---|---|
| *H01L 29/417* | (2006.01) |
| *H01L 29/66* | (2006.01) |
| *H01L 29/78* | (2006.01) |
| *H01L 29/08* | (2006.01) |

(52) U.S. Cl.
CPC .... *H01L 29/41783* (2013.01); *H01L 29/0847* (2013.01); *H01L 29/66659* (2013.01); *H01L 29/7835* (2013.01)

(58) Field of Classification Search
None
See application file for complete search history.

(56) References Cited

U.S. PATENT DOCUMENTS

| | | | | |
|---|---|---|---|---|
| 9,472,665 | B2 * | 10/2016 | Cheng | ................. H01L 29/7835 |
| 2006/0006386 | A1 * | 1/2006 | Hirler | ................... H01L 29/404 |
| | | | | 257/60 |
| 2011/0260247 | A1 * | 10/2011 | Yang | ................... H01L 29/0653 |
| | | | | 257/343 |
| 2014/0346598 | A1 * | 11/2014 | Han | ..................... H01L 29/7835 |
| | | | | 257/345 |

* cited by examiner

*Primary Examiner* — Reema Patel
*Assistant Examiner* — Steven Christopher
(74) *Attorney, Agent, or Firm* — Lau & Associates, LLC (57) ABSTRACT

The present invention discloses an LDMOS device, whose drift region is composed of a first drift region and a second drift region, the first drift region being composed of an ion implantation region formed in a selected region of the silicon substrate; the second drift region, composed of the doped polysilicon formed on the surface of the silicon substrate, is superimposed on the first drift region, with the drain region formed in the second drift region. With the second drift region of the present invention, the thickness of the entire drift region can be increased, and thus the parasitic resistance of the entire drift region can be reduced, the linear current of the device can be effectively increased, and the on-resistance of the device can be effectively reduced; the device of the present invention can also maintain a high breakdown voltage and lower process cost. The present invention further discloses a method for manufacturing the LDMOS device.

10 Claims, 6 Drawing Sheets

LDMOS DEVICE AND ITS MANUFACTURING METHOD

This application claims a foreign priority of Chinese Patent Application No. 201410262236.2 filed to the State Intellectual Property Organization on Jun. 13, 2014, which foreign application, in its entirety, is incorporated herein by reference.

FIELD OF THE INVENTION

The present invention relates to the field of semiconductor integrated circuit manufacture, especially to a lateral field effect transistor (LDMOS) device; the present invention further relates to a method for manufacturing the LDMOS device.

BACKGROUND OF THE INVENTION

A lateral field effect transistor (LDMOS), as a commonly used high-voltage semiconductor device, is widely used in power management, LCD and LED driving, ESD protection and other fields. There are usually two application methods, simulation application and switch application. When the LDMOS is used as a switch, the device needs to have a very low on-resistance (the source-drain resistance of the device in the linear region), so as to reduce the switching power consumption. In LDMOS, the length of the channel is far less than that of the drift region, the resistance of the drift region predominates over the on-resistance of the device, and therefore all the switch LDMOSs need as far as possible to have increased doping concentration of the drift region, reduced length of the drift region, and increased thickness of the drift region, so as to attain the purpose of reducing the on-resistance. However, LDMOS must meet the requirement of the breakdown voltage, and both the increase of the doping concentration of the drift region and the reduction of the length are limited to an extent. The increase of the thickness of the drift region can non-epitaxial process, which may result in excessive lateral diffusion and a too large short-channel effect, however. An epitaxial LDMOS can form a thick drift region, but the process cost is higher.

DISCLOSURE OF THE INVENTION

A technical problem to be solved by the present invention is to provide an LDMOS device, which can effectively increase the linear current of the device, reduce the on-resistance of the device, and maintain a higher breakdown voltage, having low process cost. For this, the present invention further provides a method for manufacturing the LDMOS device.

In order to resolve above technical problems, the LDMOS device provided by the present invention comprises:

a silicon substrate doped with the first conduction type;

a first drift region, composed of a second-conduction-type ion implantation region formed in a selected region of the silicon substrate;

a channel region, composed of a first-conduction-type well region formed in a selected region of the silicon substrate, the first drift region being in lateral contact at its first side with the channel region;

a polysilicon gate, formed above the channel region, spaced from the silicon substrate by a gate dielectric layer, covering a part of the channel region and extending to be above the first drift region, with the surface of the channel region covered by the polysilicon gate being used for forming a channel;

a source region, composed of a second-conduction-type heavily doped region formed in the channel region, with the source region being self-aligned with a first side of the polysilicon gate;

a second drift region, composed of the polysilicon doped with the second conduction type that is formed on the surface of the silicon substrate; the second drift region, located above the first drift region, is in contact at its bottom with the first drift region and superimposed to form the drift region of the LDMOS device; the first side of the second drift region is close to and at a distance from the second side of the polysilicon gate, with the second side of the second drift region extending away from the second side of the polysilicon gate; and a drain region, composed of a second-conduction-type heavily doped region formed in a selected region of the second drift region, close to the second side of the second drain region and at a lateral distance from the second side of the polysilicon gate.

Regulating the on-resistance of the LDMOS device by regulating the thickness of the second drift region; the thicker the second drift region is, the less the parasitic resistance of the drift region of the LDMOS device is, and the less the on-resistance of the LDMOS device is.

As a further improvement, the polysilicon of the second drift region and that of the polysilicon gate are formed simultaneously by the same process.

As a further improvement, the first side of the second drift region is spaced at its bottom from the first drift region by the gate dielectric layer, and the second side of the second drift region extends to a field oxygen isolation layer located on the outer side of the second side of the first drift region, with the gate dielectric layer at the bottom of the second drift region and the field oxygen isolation layer used as an end point of the polysilicon etching so as to facilitate etching the polysilicon of the second drift region.

As a further improvement, the first side of the second drift region and the second side of the polysilicon gate are isolated from each other by a silicon nitride sidewall.

As a further improvement, impurities of the second drift region are formed by in-position doping when the polysilicon of the second drift region is deposited or by ion implantation doping after the deposition.

As a further improvement, the LDMOS device is an N-type device, with the first conduction type being P type and the second conduction type being N type; alternatively, the LDMOS device is a P-type device, with the first conduction type being N type and the second conduction type being P type.

As a further improvement, the LDMOS device is an asymmetric device; or the LDMOS device is a symmetric device.

In order to resolve above technical problems, the method for manufacturing the LDMOS device provided by the present invention comprises the following steps:

Step 1: providing a silicon substrate doped with the first conduction type; and preparing a field oxygen isolation layer on the silicon substrate;

Step 2: forming a channel region by the ion implantation in a first-conduction-type well region in the selected region of the silicon substrate, with a photoetching process being used for defining the selected region for forming the channel region;

Step 3: forming the first drift region in the selected region of the silicon substrate by the second-conduction-type ion implantation process, with the photoetching process being used for defining the selected region for forming the first drift region, the first drift region being in lateral contact at its first side with the channel region;

Step 4: performing a furnace annealing treatment on the channel region and the first drift region;

Step 5: growing the gate dielectric layer on the surface of the silicon substrate;

Step 6: partially removing the gate dielectric layer by the photoetching process, with the gate dielectric layer partially removed being the gate dielectric layer located in a region where the first drift region is in contact with the subsequent second drift region;

Step 7: depositing the polysilicon on the front surface of the substrate after the gate dielectric layer is etched; and performing in-position second-conduction-type impurity doping or no doping in the process of depositing the polysilicon;

Step 8: using an overall ion implantation process to dope the polysilicon with the second-conduction-type impurities;

Step 9: using a rapid thermal annealing process to treat the doping impurities of the polysilicon;

Step 10: using the photoetching process to etch the polysilicon to simultaneously form the polysilicon gate and the second drift region;

the polysilicon gate, located above the channel region, covers a part of the channel region and extends to be above the first drift region, with the surface of the channel region covered by the polysilicon gate being used for forming a channel;

the second drift region, located above the first drift region, is in contact at its bottom with the first drift region and superimposed to form the drift region of the LDMOS device; the first side of the second drift region is close to and at a distance from the second side of the polysilicon gate, with the second side of the second drift region extending away from the second side of the polysilicon gate; the first side of the second drift region is spaced at its bottom from the first drift region by the dielectric layer, and the second side of the second drift region extends to the field oxygen isolation layer located on the outer side of the second side of the first drift region, with the gate dielectric layer at the bottom of the second drift region and the field oxygen isolation layer used as an end point of the polysilicon etching so as to facilitate etching the polysilicon of the second drift region;

regulating the on-resistance of the LDMOS device by regulating thickness of the second drift region; the thicker the second drift region is, the less the parasitic resistance of the drift region of the LDMOS device is, and the less the on-resistance of the LDMOS device is;

Step 11: thermally oxidizing the surface of the polysilicon gate and the polysilicon of the second drift region to form a thermal oxide layer;

Step 12: depositing a silicon nitride film, and dry etching the silicon nitride film to form the silicon nitride sidewall on the side of the polysilicon gate and the second drift region; and Step 13: forming the source region and drain region by the second-conduction-type heavily doping ion implantation, with the source region being formed in the channel region and self-aligned with the first side of the polysilicon gate; the drain region, formed in the selected region of the second drift region, is close to the second side of the second drain region and at a lateral distance from the second side of the polysilicon gate.

As a further improvement, the LDMOS device is an N-type device, with the first conduction type being P type and the second conduction type being N type, the ion implantation impurities of the channel region in Step 2 being boron or indium, the in-position doping impurities of the polysilicon in Step 7 being phosphorus, the ion implantation impurities of the polysilicon in Step 8 being phosphorus; alternatively, the LDMOS device is a P-type device, with the first conduction type being N type and the second conduction type being P type, the ion implantation impurities of the channel region in Step 2 being phosphorus or arsenic, the in-position doping impurities of the polysilicon in Step 7 being boron, the ion implantation impurities of the polysilicon in Step 8 being boron, the N-type doped silicon substrate in Step 1 being composed of a deep N well formed on a P-type silicon substrate.

As a further improvement, the furnace annealing in Step 4 is carried out at a temperature of 900° C.-1200° C. for 0.5-5 hours, and the rapid thermal annealing in Step 9 is carried out at a temperature of 1000° C. for over 10 seconds; the thermal oxide layer formed in Step 11 has a thickness of 20-100 angstroms.

The drift region of the present invention is formed by superimposition of the first drift region composed of the ion implantation diffusion region formed in the substrate over the second drift region formed by the polysilicon doping; compared with the prior art where the drift region is only composed of the ion implantation diffusion region formed in the substrate, the presence of the second drift region of the present invention can increase the thickness of the entire drift region and thus reduce the parasitic resistance of the entire drift region, and can effectively increase the linear current of the device and reduce the on-resistance of the device; besides, the present invention does not need to reduce the parasitic resistance of the drift region by increasing the doping concentration of the first drift region and second drift region, and therefore the device of the present invention can also maintain a higher breakdown voltage; the second drift region of the present invention is composed of polysilicon, which can be formed synchronously with the polysilicon used in the polysilicon gate, and thus the present invention has lower process cost.

BRIEF DESCRIPTION OF THE DRAWINGS

The present invention will be further described below in detail with reference to drawings and embodiments.

DETAILED DESCRIPTION OF THE EMBODIMENTS

The LDMOS device of the example of the present invention comprises:

a silicon substrate doped with the first conduction type;

a first drift region, composed of a second-conduction-type ion implantation region formed in a selected region of the silicon substrate;

a channel region, composed of a first-conduction-type well region formed in a selected region of the silicon substrate, the first drift region being in lateral contact at its first side with the channel region;

a polysilicon gate, formed above the channel region, spaced from the silicon substrate by a gate dielectric layer, covering a part of the channel region and extending to be above the first drift region, with the surface of the channel region covered by the polysilicon gate being used for forming a channel;

a source region, composed of a second-conduction-type heavily doped region formed in the channel region, with the source region being self-aligned with a first side of the polysilicon gate;

a second drift region, composed of the polysilicon doped with the second conduction type that is formed on the surface of the silicon substrate, located above the first drift region, and in contact at its bottom with the first drift region and superimposed to form the drift region of the LDMOS device; the first side of the second drift region is close to and at a distance from the second side of the polysilicon gate, with the second side of the second drift region extending away from the second side of the polysilicon gate; and a drain region, composed of a second-conduction-type heavily doped region formed in a selected region of the second drift region, close to the second side of the second drain region, and at a lateral distance from the second side of the polysilicon gate.

Regulating the on-resistance of the LDMOS device by regulating the thickness of the second drift region; the thicker the second drift region is, the less the parasitic resistance of the drift region of the LDMOS device is, and the less the on-resistance of the LDMOS device is.

The polysilicon of the second drift region and that of the polysilicon gate are formed simultaneously by the same process.

The first side of the second drift region is spaced at its bottom from the first drift region by the dielectric layer, and the second side of the second drift region extends to a field oxygen isolation layer located on the outer side of the second side of the first drift region, with the gate dielectric layer at the bottom of the second drift region and the field oxygen isolation layer used as an end point of the polysilicon etching so as to facilitate etching the polysilicon of the second drift region.

The first side of the second drift region and the second side of the polysilicon gate are isolated from each other by a silicon nitride sidewall.

Impurities of the second drift region are formed by in-position doping when the polysilicon of the second drift region is deposited or by ion implantation doping after the deposition.

The LDMOS device of the example of the present invention may be asymmetric or symmetric.

Figure 1:
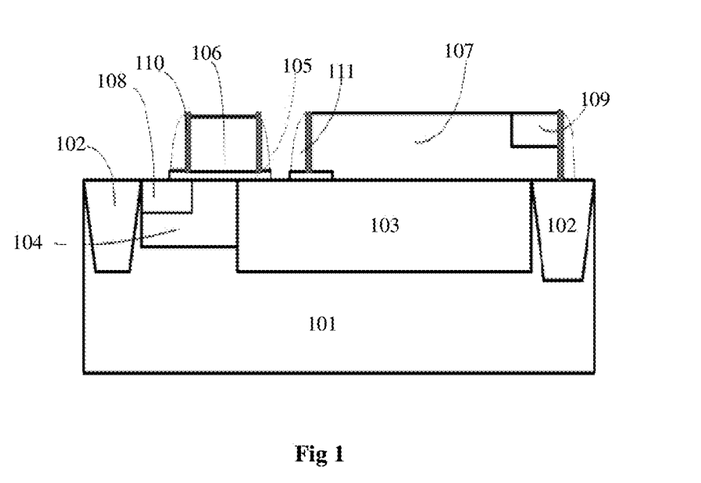
FIG. 1 is a structural schematic view of the LDMOS device in Example 1 of the present invention.

The LDMOS device of the example of the present invention may be an N-type LDMOS device or a P-type LDMOS device. FIG. 1 is a structural schematic view of the LDMOS device in Example 1 of the present invention, wherein the LDMOS device is an N-type LDMOS device, with the first conduction type being P type and the second conduction type being N type. The LDMOS device in Example 1 of the present invention comprises:

a P-type doped silicon substrate 101, with a field oxygen isolation layer 102 formed on the silicon substrate 101;

a first drift region 103, composed of an N-type ion implantation region formed in a selected region of the silicon substrate 101;

a channel region 104, composed of a P-type well region formed in a selected region of the silicon substrate 101, with the first drift region 103 being in lateral contact at its first side with the channel region 104;

a polysilicon gate 106, formed above the channel region 104, spaced from the silicon substrate 101 by a gate dielectric layer 105, preferably, the gate dielectric layer 5 being a gate oxide layer; the polysilicon gate 106 covers a part of the channel region 104 and extends to be above the first drift region 103, with the surface of the channel region 104 covered by the polysilicon gate 106 being used for forming a channel;

a source region 108, composed of an N-type heavily doped region formed in the channel region 104, with the source region 108 being self-aligned with a first side of the polysilicon gate 106;

a second drift region 107, composed of the N-type doped polysilicon formed on the surface of the silicon substrate 101, located above the first drift region 103, and in contact at its bottom with the first drift region 103 and superimposed to form the drift region of the LDMOS device; the first side of the second drift region 107 is close to and at a distance from the second side of the polysilicon gate 106, and the second side of the second drift region 107 extends away from the second side of the polysilicon gate 106;

the polysilicon of the second drift region 107 and that of the polysilicon gate 106 are formed simultaneously by the same process; the second drift region 107 is lightly N-type doped, while the polysilicon gate 106 is heavily N-type doped, meeting the requirement of being as a gate and a drift region, respectively; a thermal oxide layer 110 is formed on the surface of both the second drift region 107 and the polysilicon gate 106, and a silicon nitride sidewall 111 is formed on the side of both the second drift region 107 and the polysilicon gate 106; the first side of the second drift region 107 and the second side of the polysilicon gate 106 are isolated from each other by the silicon nitride sidewall 111; impurities of the second drift region 107 are formed by in-position doping when the polysilicon of the second drift region 107 is deposited or by ion implantation doping after the deposition; and a drain region 109, composed of an N-type heavily doped region formed in a selected region of the second drift region 107, close to the second side of the second drain region 107 and at a lateral distance from the second side of the polysilicon gate 106.

In Example 1 of the present invention, regulating on-resistance of the LDMOS device by regulating thickness of the second drift region 107, the thicker the second drift region 107 is, the less the parasitic resistance of the drift region of the LDMOS device is, and the less the on-resistance of the LDMOS device is.

Preferably, the first side of the second drift region 107 is spaced at its bottom from the first drift region 103 by the dielectric layer 105, and the second side of the second drift region 107 extends to a field oxygen isolation layer 102 located on the outer side of the second side of the first drift region 103, with the gate dielectric layer 105 at the bottom of the second drift region 107 and the field oxygen isolation layer 102 used as an end point of the polysilicon etching so as to facilitate etching the polysilicon of the second drift region 107.

Figure 2:
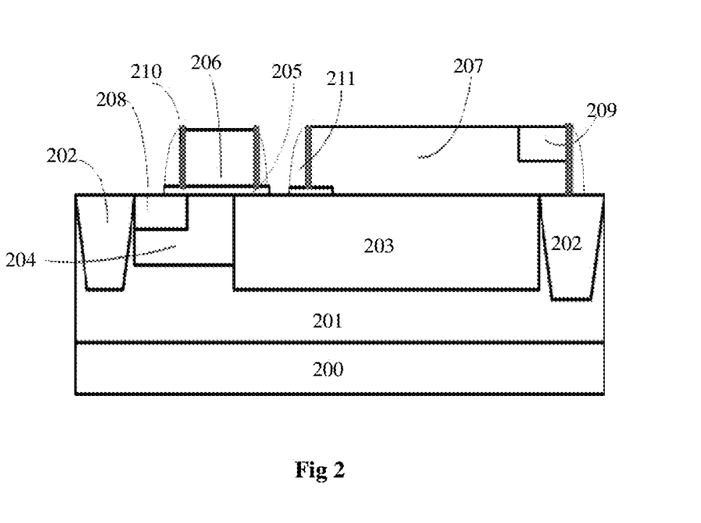
FIG. 2 is a structural schematic view of the LDMOS device in Example 2 of the present invention.

FIG. 2 is a structural schematic view of the LDMOS device in Example 2 of the present invention, wherein the LDMOS device is a P-type LDMOS device, with the first conduction type being N type and the second conduction type being P type. The structure of the LDMOS device in Example 2 of the present invention can be achieved simply by interchanging the doping conduction type between P type and N type in Example 1 of the present invention; specifically, the LDMOS device in Example 2 of the present invention comprises:

an N-type doped silicon substrate 200; a P-type doped structure is still selected for the silicon substrate 200 in Example 2 of the present invention, with such a structure as an N-type doped silicon substrate 200 being achieved by forming an N-type doped deep N well 201 in the P-type silicon substrate 200; a field oxygen isolation layer 202 is formed on the silicon substrate 101;

a first drift region 203, composed of a P-type ion implantation region formed in a selected region of the deep N well 201 of the silicon substrate 200;

a channel region 204, composed of an N-type well region formed in a selected region of the deep N well 201 of the silicon substrate 200, with the first drift region 203 being in lateral contact at its first side with the channel region 204;

a polysilicon gate 206; formed above the channel region 204, spaced from the deep N well 201 of the silicon substrate 200 by a gate dielectric layer 205, preferably, the gate dielectric layer 205 being a gate oxide layer; the polysilicon gate 206 covers a part of the channel region 204 and extends to be above the first drift region 203, with the surface of the channel region 204 covered by the polysilicon gate 206 being used for forming a channel;

a source region 208, composed of a P-type heavily doped region formed in the channel region 204, with the source region 208 being self-aligned with a first side of the polysilicon gate 206;

a second drift region 207, composed of the P-type doped polysilicon formed on the surface of the deep N well 201 of the silicon substrate 200, with the polysilicon of the second drift region 207 and that of the polysilicon gate 206 being formed simultaneously by the same process; the second drift region 207 is lightly P-type doped, while the polysilicon gate 206 is heavily P-type doped, meeting the requirement of being as a gate and a drift region, respectively;

the second drift region 207, located above the first drift region 203, is in contact at its bottom with the first drift region 203 and superimposed to form the drift region of the LDMOS device; the first side of the second drift region 207 is close to and at a distance from the second side of the polysilicon gate 206, with the second side of the second drift region 207 extending away from the second side of the polysilicon gate 206;

a thermal oxide layer 210 is formed on the surface of both the second drift region 207 and the polysilicon gate 206, and a silicon nitride sidewall 211 is formed on the side of both the second drift region 207 and the polysilicon gate 206; the first side of the second drift region 207 and the second side of the polysilicon gate 206 are isolated from each other by the silicon nitride sidewall 211; impurities of the second drift region 207 are formed by in-position doping when the polysilicon of the second drift region 207 is deposited or by ion implantation doping after the deposition;

the first side of the second drift region 207 is spaced at its bottom from the first drift region 203 by the dielectric layer 205, and the second side of the second drift region 207 extends to a field oxygen isolation layer 202 located on the outer side of the second side of the first drift region 203, with the gate dielectric layer 205 at the bottom of the second drift region 207 and the field oxygen isolation layer 202 used as an end point of the polysilicon etching so as to facilitate etching the polysilicon of the second drift region 207;

a drain region 209, composed of a P-type heavily doped region formed in a selected region of the second drift region 207, close to the second side of the second drain region 207 and at a lateral distance from the second side of the polysilicon gate 206.

Regulating the on-resistance of the LDMOS device by regulating thickness of the second drift region 207; the thicker the second drift region 207 is, the less the parasitic resistance of the drift region of the LDMOS device is, and the less the on-resistance of the LDMOS device is.

Figure 3A:
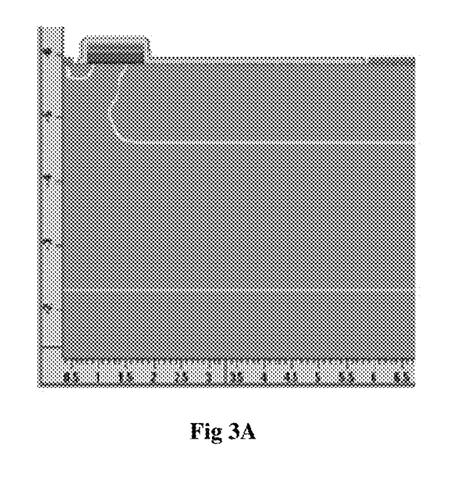
FIG. 3A is a device simulation graph of the semiconductor process simulation and device simulation tool (Technology Computer Aided Design, TCAD) of the existing LDMOS device.
Figure 3B:
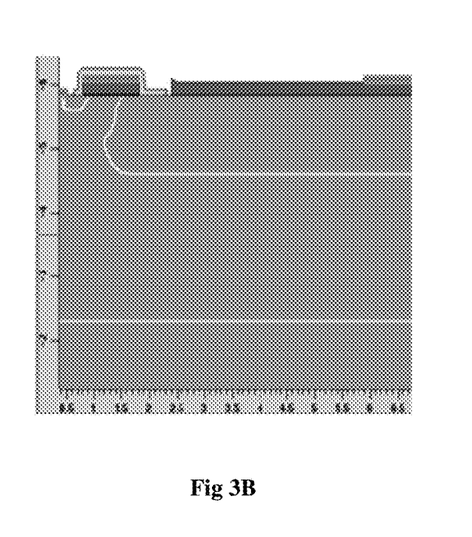
FIG. 3B is a TCAD device simulation graph of the LDMOS device in Example 1 of the present invention.
Figure 3C:
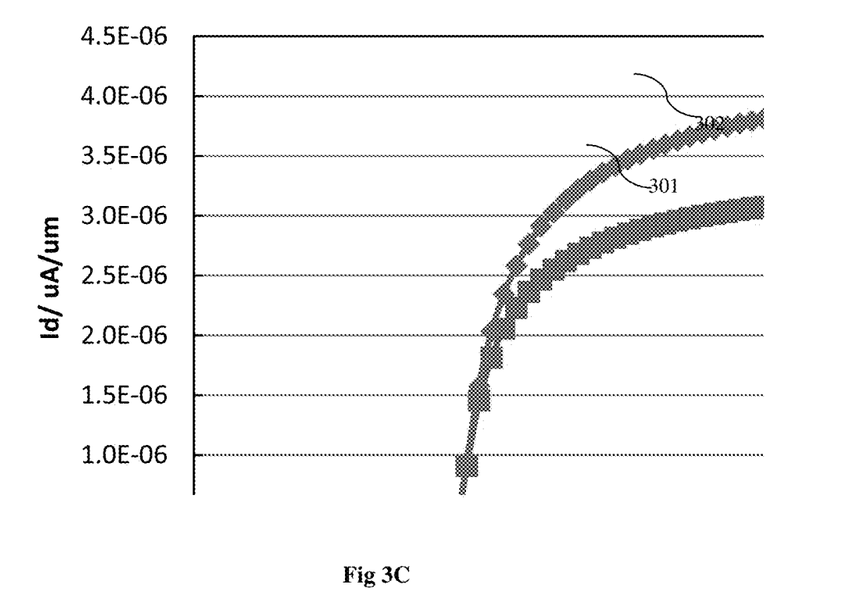
FIG. 3C is a graph of comparison of the linear source-drain current in relation to the gate voltage between the LDMOS device in Example 1 of the present invention and the TCAD simulation of the existing LDMOS device.

FIGS. 3A and 3B are the TCAD device simulation graph of an existing LDMOS device and the LDMOS device in Example 1 of the present invention, respectively; and FIG. 3C is a graph of comparison of the linear source-drain current in relation to the gate voltage between the LDMOS device in Example 1 of the present invention and the TCAD simulation of the existing LDMOS device. It can be known that, after the LDMOS device in Example 1 of the present invention has an additional second drift region composed of polysilicon compared to the existing LDMOS device, the thickness of the drift region will increase, and the parasitic resistance of the entire drift region can be reduced. The curve 301 in FIG. 3C corresponds to the curve of relation between the linear source-drain current and the gate voltage of the existing LDMOS device, while the curve 302 corresponds to the curve of relation between the linear source-drain current and the gate voltage of the LDMOS device in Example 1 of the present invention. It can be known that the linear current of the LDMOS device in Example 1 of the present invention is increased, and the on-resistance of the device is reduced. This sufficiently verifies that the additional second drift region in Example 1 of the present invention does effectively increase the linear current of the device and reduce the on-resistance of the device, and can maintain a higher breakdown voltage.

Figure 4A:
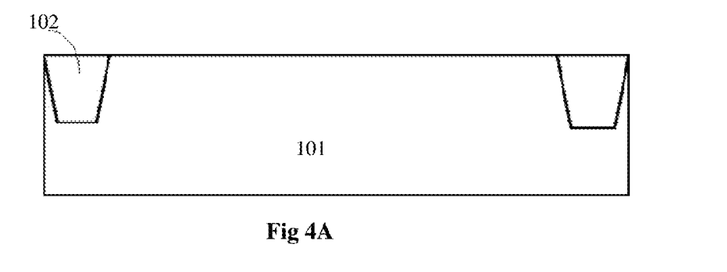
FIG. 4A-4I are a structural schematic view of the LDMOS device in each of the steps in the method of Example 1 of the present invention.

FIGS. 4A-4I are a structural schematic view of the LDMOS device in each of the steps in the method of Example 1 of the present invention. The method for manufacturing the LDMOS device as provided in Example 1 of the present invention comprises the following steps:

Step 1: As shown in FIG. 4A, providing a P-type doped silicon substrate 101, and preparing a field oxygen isolation layer 102 on the silicon substrate 101; the field oxygen isolation layer 102 is a local field oxygen isolation layer (LOCOS) or a shallow trench isolation (STI) layer.

Figure 4B:
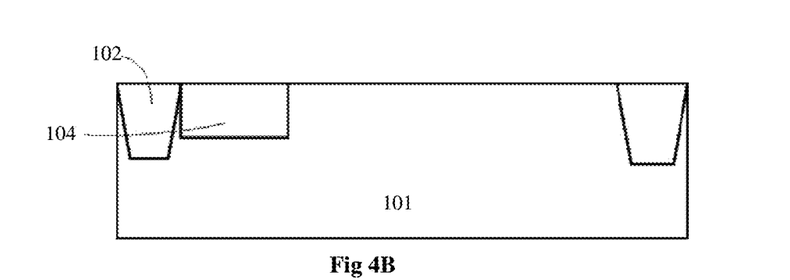

Step 2: As shown in FIG. 4B, forming a channel region 104 by ion implantation in the P-type well region in the selected region of the silicon substrate 101, with a photoetching process being used for defining the selected region for forming the channel region 104; the ion implantation impurities of the channel region 104, being boron or indium, allow multiple ion implantations.

Figure 4C:
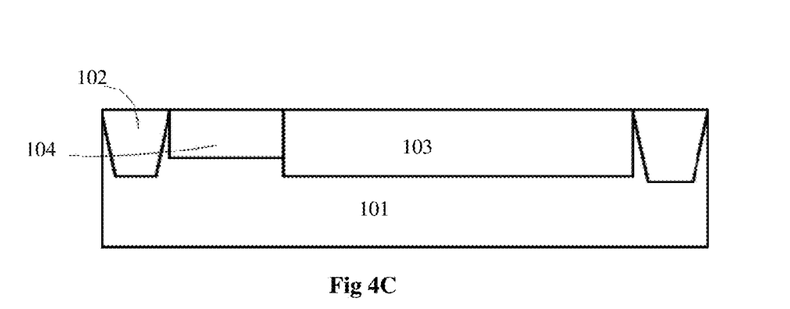

Step 3: As shown in FIG. 4C, forming the first drift region 103 in the selected region of the silicon substrate 101 by the N-type ion implantation process, the photoetching process being used for defining the selected region for forming the first drift region 103, the first drift region 103 being in lateral contact at its first side with the channel region 104; the ion implantation impurities of the first drift region 103, usually phosphorus, allow multiple ion implantations of different energy.

Step 4: As shown in FIG. 4C, performing a furnace annealing treatment on the channel region 104 and the first drift region 103; preferably, the furnace annealing is carried out at a temperature of 900° C.-1200° C. for 0.5-5 hours.

Figure 4D:
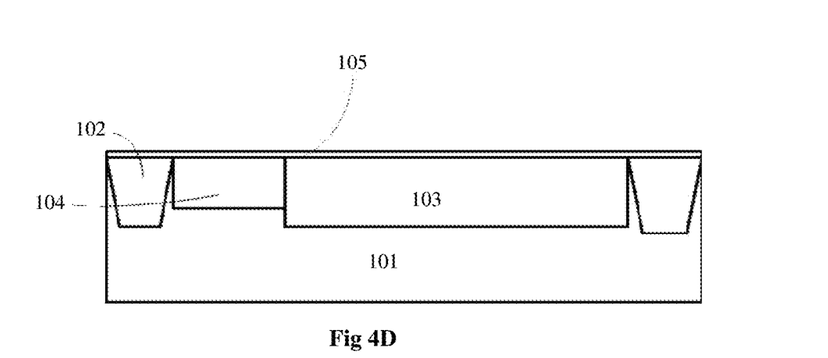

Step 5: As shown in FIG. 4D, growing the gate dielectric layer 105 on the surface of the silicon substrate 101; preferably, the gate dielectric layer 105 is a gate oxide layer.

Figure 4E:
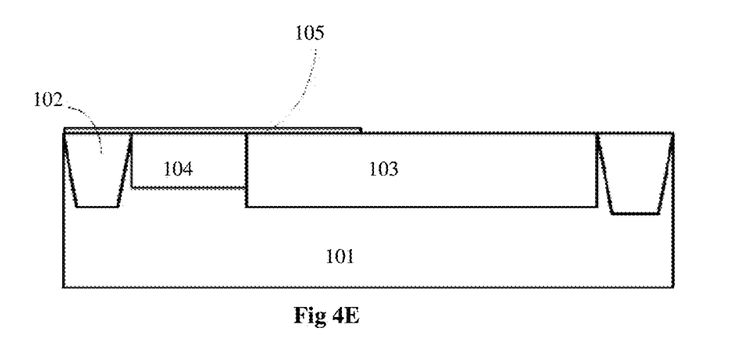

Step 6: As shown in FIG. 4E, partially removing the gate dielectric layer 105 by the photoetching process, with the gate dielectric layer 105 partially removed being the gate dielectric layer 105 located in a region where the first drift region 103 is in contact with the subsequent second drift region 107.

Figure 4F:
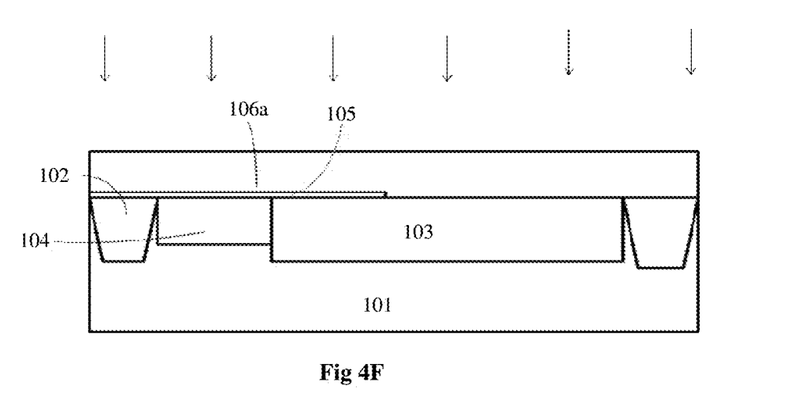

Step 7: As shown in FIG. 4F, depositing the polysilicon 106a on the front surface of the substrate after the gate dielectric layer 105 is etched; performing in-position N-type impurity doping or no doping in the process of depositing the polysilicon 106a; preferably, the in-position N-type doping impurities are phosphorus.

Step 8: As shown in FIG. 4F, using an overall ion implantation process to dope the polysilicon 106a with the N-type impurities; preferably, the ion implantation impurities of the polysilicon are phosphorus.

Step 9: As shown in FIG. 4F, using a rapid thermal annealing process to treat the doping impurities of the polysilicon 106a; preferably, the rapid thermal annealing is carried out at a temperature of 1000° C. for over 10 seconds.

Figure 4G:
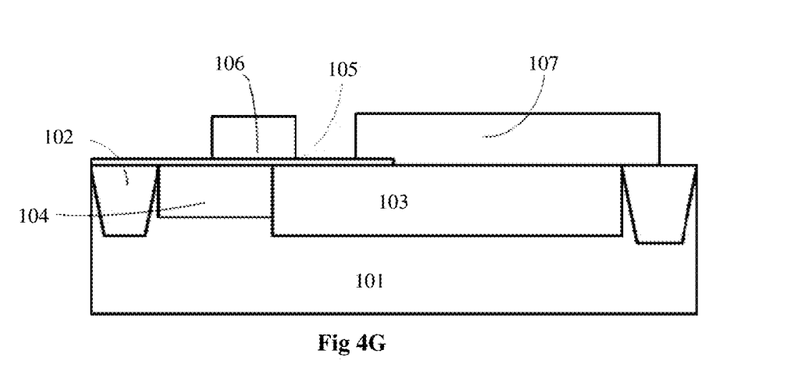

Step 10: As shown in FIG. 4G, using the photoetching process to etch the polysilicon to simultaneously form the polysilicon gate 106 and the second drift region 107;
the polysilicon gate 106, located above the channel region 104, covers a part of the channel region 104 and extends to be above the first drift region 103, with the surface of the channel region 104 covered by the polysilicon gate 106 being used for forming a channel;
the second drift region 107, located above the first drift region 103, is in contact at its bottom with the first drift region 103 and superimposed to form the drift region of the LDMOS device; the first side of the second drift region 107 is close to and at a distance from the second side of the polysilicon gate 106, the second side of the second drift region 107 extending away from the second side of the polysilicon gate 106; the first side of the second drift region 107 is spaced at its bottom from the first drift region 103 by the dielectric layer 105, and the second side of the second drift region 107 extends to the field oxygen isolation layer 102 located on the outer side of the second side of the first drift region 103, with the gate dielectric layer 105 at the bottom of the second drift region 107 and the field oxygen isolation layer 102 used as an end point of the polysilicon etching so as to facilitate etching the polysilicon of the second drift region 107;
regulating the on-resistance of the LDMOS device by regulating the thickness of the second drift region 107; the thicker the second drift region 107 is, the less the parasitic resistance of the drift region of the LDMOS device is, and the less the on-resistance of the LDMOS device is.

Figure 4H:
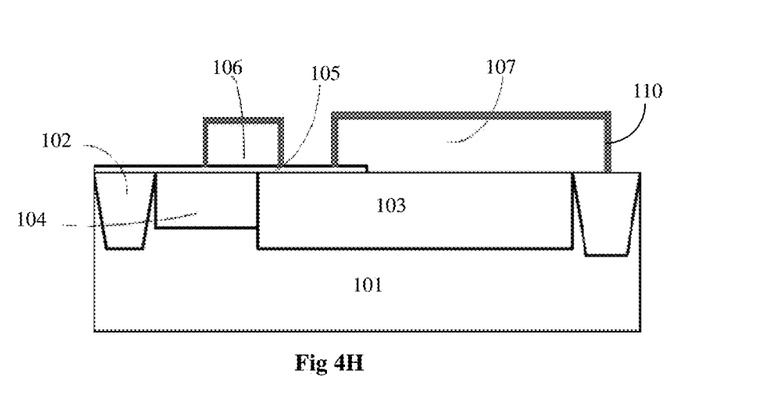

Step 11: As shown in FIG. 4H, thermally oxidizing the surface of the polysilicon gate 106 and the polysilicon of the second drift region 107 to form a thermal oxide layer 110; preferably, the thickness of the thermal oxide layer 110 is 20-100 angstroms.

Figure 4I:
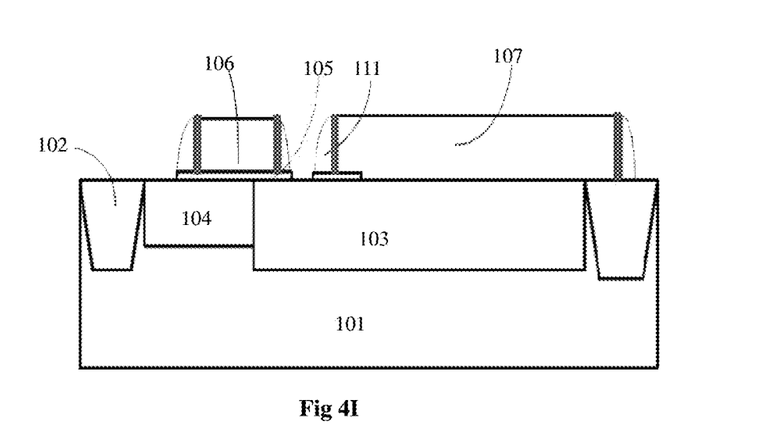

Step 12: As shown in FIG. 4I, depositing a silicon nitride film, and dry etching the silicon nitride film to form the silicon nitride sidewall 111 on the side of the polysilicon gate 106 and the second drift region 107.

Step 13: As shown in FIG. 1, forming the source region 108 and the drain region 109 by the N-type heavily doping ion implantation, with the source region 108 being formed in the channel region 104 and self-aligned with a first side of the polysilicon gate 106; the drain region 109, formed in the selected region of the second drift region 107, is close to the second side of the second drain region 107 and at a lateral distance from the second side of the polysilicon gate 106.

See FIG. 2 for the following steps. The method for manufacturing the LDMOS device as provided in Example 2 of the present invention comprises the following steps:

Step 1: Providing an N-type doped silicon substrate, and preparing a field oxygen isolation layer on the silicon substrate; the N-type doped silicon substrate in the example of the present invention is obtained by the P-type doped silicon substrate plus the replacement of the deep N well 201 formed in the P-type silicon substrate 200.

Step 2: Forming a channel region 204 by ion implantation in the N-type well region in the selected region of the deep N well 201 of the silicon substrate 200, with a photoetching process being used for defining the selected region for forming the channel region 204.

Step 3: Forming the first drift region 203 in the selected region of the deep N well 201 of the silicon substrate 200 by the P-type ion implantation process, the photoetching process being used for defining the selected region for forming the first drift region 203, the first drift region 203 being in lateral contact at its first side with the channel region 204.

Step 4: Performing a furnace annealing treatment on the channel region 204 and the first drift region 203; preferably, the furnace annealing is carried out at a temperature of 900° C.-1200° C. for 0.5-5 hours.

Step 5: Growing the gate dielectric layer 205 on the surface of the deep N well 201 of the silicon substrate 200; preferably, the gate dielectric layer 205 is a gate oxide layer.

Step 6: Partially removing the gate dielectric layer 205 by the photoetching process, with the gate dielectric layer 205 partially removed being the gate dielectric layer 205 located in a region where the first drift region 203 is in contact with the subsequent second drift region 207.

Step 7: Depositing the polysilicon on the front surface of the substrate after the gate dielectric layer 205 is etched, and performing in-position P-type impurity doping or no doping in the process of depositing the polysilicon; preferably, the in-position P-type doping impurities are boron.

Step 8: Using an overall ion implantation process to dope the polysilicon with the P-type impurities; preferably, the ion implantation impurities of the polysilicon are boron.

Step 9: Using a rapid thermal annealing process to treat the doping impurities of the polysilicon; preferably, the rapid thermal annealing is carried out at a temperature of 1000° C. for over 10 seconds.

Step 10: Using the photoetching process to etch the polysilicon to simultaneously form the polysilicon gate 206 and the second drift region 207;
the polysilicon gate 206, located above the channel region 204, covers a part of the channel region 204 and extends to be above the first drift region 203, with the surface of the channel region 204 covered by the polysilicon gate 206 being used for forming a channel;

the second drift region 207, located above the first drift region 203, is in contact at its bottom with the first drift region 203 and superimposed to form the drift region of the LDMOS device; the first side of the second drift region 207 is close to and at a distance from the second side of the polysilicon gate 206, the second side of the second drift region 207 extending away from the second side of the polysilicon gate 206; the first side of the second drift region 207 is spaced at its bottom from the first drift region 203 by the dielectric layer 205, and the second side of the second drift region 207 extends to the field oxygen isolation layer located on the outer side of the second side of the first drift region 203, with the gate dielectric layer 205 at the bottom of the second drift region 207 and the field oxygen isolation layer used as an end point of the polysilicon etching so as to facilitate etching the polysilicon of the second drift region 207;

regulating the on-resistance of the LDMOS device by regulating the thickness of the second drift region 207; the thicker the second drift region 207 is, the less the parasitic resistance of the drift region of the LDMOS device is, and the less the on-resistance of the LDMOS device is.

Step 11: Thermally oxidizing the surface of the polysilicon gate 206 and the polysilicon of the second drift region 207 to form a thermal oxide layer 210; preferably, the thickness of the thermal oxide layer 210 is 20-100 angstroms.

Step 12: Depositing a silicon nitride film, and dry etching the silicon nitride film to form the silicon nitride sidewall 211 on a side of the polysilicon gate 206 and the second drift region 207.

Step 13: Forming the source region 208 and the drain region 209 by the P-type heavily doping ion implantation, with the source region 208 being formed in the channel region 204 and self-aligned with a first side of the polysilicon gate 206; the drain region 209, formed in the selected region of the second drift region 207, is close to the second side of the second drain region 207 and at a lateral distance from the second side of the polysilicon gate 206.

The present invention is described above in detail through specific examples, which however do not restrict the present invention. Without departing from the principle of the present invention, those skilled in the art may also make many alterations and improvements, which should also be considered to be within the scope of protection of the present invention.

What is claimed is:

1. A lateral field effect transistor (LDMOS) device, comprising:
    a silicon substrate doped with a first conduction type;
    a first drift region, composed of a second-conduction-type ion implantation region formed in a selected region of the silicon substrate;
    a channel region, composed of a first-conduction-type well region formed in a selected region of the silicon substrate, the first drift region being in lateral contact on its first side with the channel region;
    a polysilicon gate, formed above the channel region, spaced from the silicon substrate by a gate dielectric layer, covering a part of the channel region and extending to be above the first drift region, with the surface of the channel region covered by the polysilicon gate being used for forming a channel;
    a source region, composed of a second-conduction-type heavily doped region formed in the channel region, with the source region being self-aligned with a first side of the polysilicon gate;
    a second drift region composed of the polysilicon doped with a second conduction type that is formed on the surface of the silicon substrate, located above the first drift region, and in contact at its bottom with the first drift region and superimposed to form a drift region of the LDMOS device; the first side of the second drift region is located at a set distance from the second side of the polysilicon gate, with the second side of the second drift region extending away from the second side of the polysilicon gate; wherein a top of the polysilicon gate and a bottom of the dielectric layer are at equidistance heights relative to a top of the drift region and a bottom of the drift region, respectively;
    a drain region, composed of a second-conduction-type heavily doped region formed in a selected region of the second drift region, close to toe second side of the second drift region and at a lateral distance from the second side of the polysilicon gate.

2. The lateral field effect transistor LDMOS device according to claim 1, wherein the polysilicon of the second drift region and the polysilicon gate are formed simultaneously by the same process.

3. The lateral field effect transistor LDMOS device according to claim 1, wherein the first side of the second drift region and the second side of the polysilicon gate are isolated from each other by a silicon nitride sidewall.

4. The lateral field effect transistor LDMOS device according to claim 1, wherein the LDMOS device is an N-type device, with the first conduction type being P type and the second conduction type being N type; alternatively, the LDMOS device is a P-type device, with the first conduction type being N type and the second conduction type being P type.

5. The lateral field effect transistor LDMOS device according to claim 1, wherein the LDMOS device is an asymmetric device; or the LDMOS device is a symmetric device.

6. The lateral field effect transistor LDMOS device according to claim 2, wherein the first side of the second drift region is spaced at its bottom from the first drift region by the dielectric layer, and the second side of the second drift region extends to a field oxygen isolation layer located on the outer side of the second side of the first drift region, with the gate dielectric layer at the bottom of the second drift region and the field oxygen isolation layer used as an end point of the polysilicon etching so as to facilitate etching the polysilicon of the second drift region.

7. The lateral field effect transistor LDMOS device according to claim 2, wherein the first side of the second drift region and the second side of the polysilicon gate are isolated from each other by a silicon nitride sidewall.

8. The lateral field effect transistor LDMOS device according to claim 2, wherein the LDMOS device is one of an N-type device, the first conduction type being P type, the second conduction type being N type and the LDMOS device is a P-type device, the first conduction type being N type, the second conduction type being P type.

9. The lateral field effect transistor LDMOS device according to claim 2, wherein the LDMOS device is an asymmetric device.

10. The lateral field effect transistor LDMOS device according to claim 2, wherein the LDMOS device is a symmetric device.

* * * * *

UNITED STATES PATENT AND TRADEMARK OFFICE
CERTIFICATE OF CORRECTION

PATENT NO. : 9,997,605 B2
APPLICATION NO. : 14/580126
DATED : June 12, 2018
INVENTOR(S) : Wensheng Qian It is certified that error appears in the above-identified patent and that said Letters Patent is hereby corrected as shown below:

On the Title Page

Item [30], insert --Jun. 13, 2014 (CN) 201410262236.2--.

Signed and Sealed this
Second Day of October, 2018

Andrei Iancu
*Director of the United States Patent and Trademark Office*